US010653000B2

(12) United States Patent
Lo et al.

(10) Patent No.: US 10,653,000 B2
(45) Date of Patent: May 12, 2020

(54) ELECTRICAL CONNECTOR ASSEMBLY CAPABLE OF TRANSMITTING HIGH-FREQUENCY SIGNALS

(71) Applicant: Lintes Technology Co., Ltd, New Taipei (TW)

(72) Inventors: Wei Zen Lo, New Taipei (TW); Shih Chi Kuan, New Taipei (TW)

(73) Assignee: LINTES TECHNOLOGY CO., LTD, New Taipei (TW)

( * ) Notice: Subject to any disclaimer, the term of this patent is extended or adjusted under 35 U.S.C. 154(b) by 0 days.

(21) Appl. No.: 16/236,711

(22) Filed: Dec. 31, 2018

(65) Prior Publication Data

US 2019/0208621 A1    Jul. 4, 2019

Related U.S. Application Data

(60) Provisional application No. 62/612,794, filed on Jan. 2, 2018.

(30) Foreign Application Priority Data

Aug. 31, 2018    (CN) .......................... 2018 1 1041015

(51) Int. Cl.
*H05K 1/02* (2006.01)
*H01R 13/6597* (2011.01)
(Continued)

(52) U.S. Cl.
CPC ....... *H05K 1/0233* (2013.01); *H01R 13/6597* (2013.01); *H05K 1/181* (2013.01);
(Continued)

(58) Field of Classification Search
CPC .............. H01R 13/6466; H01R 12/724; H01R 12/722; H01R 12/721; H01R 11/00; H01R 11/03; H05K 1/0233; H05K 1/181
(Continued)

(56) References Cited

U.S. PATENT DOCUMENTS 5,599,208 A * 2/1997 Ward ................... H01R 13/719
333/185
6,113,422 A * 9/2000 Somerville ........ H01R 13/6641
439/490

(Continued)

FOREIGN PATENT DOCUMENTS

| CN | 104283077 A | 1/2015 |
| CN | 206558836 U | 10/2017 |
| CN | 207398394 U | 5/2018 |

*Primary Examiner* — Tho D Ta
*Assistant Examiner* — Marcus E Harcum
(74) *Attorney, Agent, or Firm* — Locke Lord LLP; Tim Tingkang Xia, Esq.

(57) ABSTRACT

An electrical connector assembly includes a circuit board; a first connector which includes a first insulating body and a first terminal group, where the first terminal group is provided on the first insulating body along a longitudinal direction, the first terminal group includes multiple first signal terminals and at least one first power terminal, and the first power terminal is closer to one of two edges of the first connector along the longitudinal direction than the first signal terminal; a chip provided on the circuit board and electrically connected to the first signal terminals; and a filter provided on the circuit board and electrically connected to the first power terminal. The filter is arranged right behind the first power terminal. The chip is provided right behind the first signal terminals.

20 Claims, 7 Drawing Sheets

(51) Int. Cl.

| | | |
|---|---|---|
| *H05K 1/18* | (2006.01) | |
| *H01R 12/79* | (2011.01) | |
| *H01R 13/6585* | (2011.01) | |
| *H01R 107/00* | (2006.01) | |
| *H01R 24/60* | (2011.01) | |
| *H01R 12/72* | (2011.01) | |
| *H01R 13/6466* | (2011.01) | |
| *H01R 11/03* | (2006.01) | |
| *H01R 11/00* | (2006.01) | |

(52) U.S. Cl.
CPC .............. *H01R 11/00* (2013.01); *H01R 11/03* (2013.01); *H01R 12/721* (2013.01); *H01R 12/722* (2013.01); *H01R 12/724* (2013.01); *H01R 12/79* (2013.01); *H01R 13/6466* (2013.01); *H01R 13/6585* (2013.01); *H01R 24/60* (2013.01); *H01R 2107/00* (2013.01); *H05K 1/0243* (2013.01); *H05K 2201/09227* (2013.01); *H05K 2201/1006* (2013.01); *H05K 2201/10189* (2013.01)

(58) Field of Classification Search
USPC ............ 439/620.07, 620.12, 620.09, 620.06, 439/620.15, 638, 924.1, 502, 607.41, 660; 333/32
See application file for complete search history.

(56) References Cited

U.S. PATENT DOCUMENTS

| | | | | |
|---|---|---|---|---|
| 6,599,152 B1* | 7/2003 | Oliphant | ............ | H01R 12/721 439/638 |
| 6,692,262 B1* | 2/2004 | Loveless | ............ | H01R 24/50 439/581 |
| 6,923,683 B2* | 8/2005 | Dulai | ............ | H01R 27/02 439/638 |
| 6,939,177 B2* | 9/2005 | Kato | ............ | H01R 27/02 439/607.01 |
| 7,285,021 B2* | 10/2007 | Bell | ............ | G06F 1/1632 439/505 |
| 7,318,750 B1* | 1/2008 | Chacon | ............ | H01R 27/02 200/51.03 |
| 7,345,555 B2* | 3/2008 | Yamanaga | ............ | H01P 5/02 333/12 |
| 7,352,601 B1* | 4/2008 | Minneman | ............ | H05K 1/0284 365/185.05 |
| 7,407,390 B1* | 8/2008 | Ni | ............ | G06K 19/07732 361/752 |
| 7,445,516 B2* | 11/2008 | Chung | ............ | H01R 13/6658 439/654 |
| 7,530,818 B1* | 5/2009 | Wang | ............ | H01R 31/065 439/638 |
| 7,540,747 B2* | 6/2009 | Ice | ............ | G02B 6/4201 439/620.06 |
| 7,632,152 B2* | 12/2009 | Ho | ............ | H01R 31/065 439/638 |
| 7,666,007 B2* | 2/2010 | Hsu | ............ | H01R 13/6658 235/492 |
| 7,749,027 B2* | 7/2010 | Chow | ............ | H01R 13/6658 439/620.06 |
| 8,684,770 B2* | 4/2014 | Tai | ............ | H01R 12/592 439/497 |
| 8,888,510 B2* | 11/2014 | Webb | ............ | H01R 13/6594 439/76.1 |
| 2006/0286871 A1* | 12/2006 | Lin | ............ | H01R 13/6658 439/638 |
| 2007/0010132 A1* | 1/2007 | Nelson | ............ | G02B 6/4201 439/577 |
| 2007/0123074 A1* | 5/2007 | Nishimura | ............ | H01R 12/79 439/108 |
| 2008/0064271 A1* | 3/2008 | Hiew | ............ | H01R 13/6395 439/892 |
| 2009/0099423 A1* | 4/2009 | Al-Ali | ............ | H01R 13/6275 600/300 |
| 2011/0281469 A1* | 11/2011 | Su | ............ | H01R 4/5033 439/660 |
| 2012/0015561 A1* | 1/2012 | Tsai | ............ | H01R 24/60 439/660 |
| 2012/0289080 A1* | 11/2012 | Huang | ............ | H01R 13/6658 439/502 |
| 2013/0078858 A1* | 3/2013 | Wu | ............ | H01R 13/6592 439/607.41 |
| 2013/0084746 A1* | 4/2013 | Siahaan | ............ | H01R 13/6581 439/607.41 |
| 2013/0115821 A1* | 5/2013 | Golko | ............ | H01R 13/516 439/638 |
| 2013/0183862 A1* | 7/2013 | Ni | ............ | H01R 12/71 439/620.22 |
| 2013/0203296 A1* | 8/2013 | Ngo | ............ | H01R 24/00 439/638 |
| 2013/0309901 A1* | 11/2013 | Hilbourne | ............ | H01R 13/516 439/502 |
| 2014/0307809 A1* | 10/2014 | Lo | ............ | H04B 3/28 375/257 |
| 2015/0380860 A1* | 12/2015 | Moran | ............ | F24F 11/30 439/638 |
| 2016/0104987 A1* | 4/2016 | Hung | ............ | H01R 27/02 361/679.01 |
| 2016/0118758 A1* | 4/2016 | Cymerman | ............ | H01R 31/06 439/39 |
| 2016/0365673 A1* | 12/2016 | Liang | ............ | H01R 12/57 |

* cited by examiner

ELECTRICAL CONNECTOR ASSEMBLY CAPABLE OF TRANSMITTING HIGH-FREQUENCY SIGNALS

CROSS-REFERENCE TO RELATED PATENT APPLICATION

This non-provisional application claims priority to and the benefit of, pursuant to 35 U.S.C. § 119(e), U.S. provisional patent application Ser. No. 62/612,794 filed Jan. 2, 2018, and under 35 U.S.C. § 119(a), patent application Serial No. CN201811041015.7 filed in China on Aug. 31, 2018. The disclosure of the above applications are incorporated herein in their entireties by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to an electrical connector assembly, and particularly to an electrical connector assembly having a chip and is capable of transmitting high-frequency signals.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Currently, electronic products are widely applied to fields of home networks, e-businesses, network workstations and the like. For an electrical connector to receive high-frequency signals transmitted from outside, a chip is usually provided additionally on a printed circuit board (PCB) so as to adjust the high-frequency signals. However, the electronic products tend to be miniaturized, and the line arrangement on the PCB is compact, such that high-frequency lines are often adjacent to power lines, thereby causing interference to the high-frequency lines by the power lines.

In order to solve the foregoing problem, an existing electrical connector assembly is provided, which has the design that a filter is additionally provided on a power line on the PCB to prevent interference to a high-frequency line by the power line. However, the miniaturization design often causes a chip and the filter to be sequentially provided behind an electrical connector, which results in the need for a signal on the electrical connector to bypass the filter when the signal is transmitted to the chip, such that the circuit line design is relatively complicated and the cost is increased.

Therefore, a heretofore unaddressed need to design an electrical connector assembly exists in the art to address the aforementioned deficiencies and inadequacies.

SUMMARY

The present invention is directed to an electrical connector assembly which meets the condition that power lines do not interfere with high-frequency lines, and is simple in circuit line design and cost saving.

To solve the foregoing problems, the present invention adopts the following technical solutions.

An electrical connector assembly includes: a circuit board; a first connector provided on the circuit board and having two edges along a longitudinal direction, the first connector including a first insulating body and a first terminal group, wherein the first terminal group is provided on the first insulating body along the longitudinal direction, the first terminal group includes a plurality of first signal terminals and at least one first power terminal, and the first power terminal is located closer to one of the two edges of the first connector along the longitudinal direction than the first signal terminals; a chip provided on the circuit board, wherein the chip is electrically connected to the first signal terminals; at least one filter provided on the circuit board, wherein the filter is provided at one side of the chip, and the filter is electrically connected to the first power terminal; a second connector connected to the first connector, the second connector including a second insulating body and a second terminal group, wherein the second terminal group includes a plurality of second signal terminals and at least one second power terminal, each of the second signal terminals is connected to one of the first signal terminals, and the second power terminal is connected to the first power terminal; and a wire group electrically conductive to the second connector.

In certain embodiments, the electrical connector assembly includes two filters, wherein the two filters are respectively provided at two sides of the chip, and the first terminal group comprises two first power terminals electrically connected to the two filters respectively.

In certain embodiments, a distance between each of the first signal terminals and the chip is less than a distance between the first power terminal and the chip.

In certain embodiments, the first connector defines a center line, the center line is parallel to an insertion direction of the first connector and the second connector, and the chip is located closer to the center line than each of the two filters.

In certain embodiments, the two filters are symmetrically provided relative to the center line.

In certain embodiments, the filter and the chip are provided in a row along the longitudinal direction of the first connector.

In certain embodiments, the two edges of the first connector define two edge lines perpendicular to the longitudinal direction, each of the edge lines is parallel to an insertion direction of the first connector and the second connector, and the filter and the chip do not pass beyond the two edge lines along the longitudinal direction.

In certain embodiments, the first connector is provided with two first ground terminals, and each of the two first ground terminals is adjacent to one of the two edges of the first connector along the longitudinal direction.

In certain embodiments, the first terminal group includes four first power terminals, two of the four first power terminals are adjacent to each other, the other two of the four first power terminals are adjacent to each other, one of the two first ground terminals is located between one of the two edges of the first connector and the two of the four first power terminals adjacent to each other, and the other of the two first ground terminals is located between the other of the two edges and the other two of the four first power terminals adjacent to each other.

In certain embodiments, the first signal terminals includes four first signal terminals, two of the four first signal terminals are adjacent to each other, the other two of the four first signal terminals are adjacent to each other, the two of the four first power terminals adjacent to each other are located between the two of the four first signal terminals adjacent to each other and the one of the two first ground terminals, and the other two of the four first power terminals adjacent to each other are located between the other two of the four first signal terminals adjacent to each other and the other one of the two first ground terminals.

In certain embodiments, the electrical connector assembly further includes a third connector, and the second connector is electrically connected to the third connector through the wire group.

In certain embodiments, the wire group includes a plurality of signal wires and at least one power wire, the signal wires are connected to the second signal terminals, and the power wire is connected to the second power terminal.

In certain embodiments, the wire group has a first end being connected to the second connector and a second end being connected to the third connector, the signal wires and the power wire at the first end of the wire group are arranged in a row along the longitudinal direction, and the signal wires and the power wire at the second end of the wire group are arranged in two rows vertically.

In certain embodiments, the power wire at the first end of the wire group is provided at one of two outermost edges of the row.

In certain embodiments, the third connector includes a third insulating body and a third terminal group, the third terminal group is provided on the third insulating body along the longitudinal direction, the third terminal group includes at least one third power terminal and at least one third signal terminal, the signal wires are electrically connected to the third signal terminals, and the power wire is electrically connected to the third power terminal.

In certain embodiments, the power wire at the second end of the wire group is positioned between at least two of the signal wires.

In certain embodiments, the third connector further includes a middle shielding sheet, the third terminal group includes third terminals in an upper row and third terminals in a lower row, the middle shielding sheet is provided between the third terminals in the upper row and the third terminals in the lower row, the third terminal group includes a plurality of third ground terminals, and the third ground terminals are provided at two outermost sides of the third terminals in the upper row and the third terminals in the lower row.

In certain embodiments, one end of the wire group adjacent to the third connector is provided with a plurality of grounding sheets and solder pastes, the grounding sheets include an upper grounding sheet, a lower grounding sheet and two middle grounding sheets, the solder pastes are respectively provided between the upper grounding sheet and one of the middle grounding sheets and between the lower grounding sheet and the other of the middle grounding sheets, the third ground terminals are soldered to the middle grounding sheets through the solder pastes, the middle shielding sheet is provided with a plurality of pins, and the pins are provided between the two middle grounding sheets and soldered to the middle grounding sheets.

Compared with the related art, the present invention has the following beneficial effects: the first power terminal is located closer to one side of the edge of the first connector along the longitudinal direction than the first signal terminals, the chip is provided right behind the first signal terminals, and the filter can be directly mounted right behind the first power terminal. When transmitting a high-frequency signal to the first signal terminals, the chip does not need to bypass the filter, such that the circuit line design is simple and the cost is saved.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
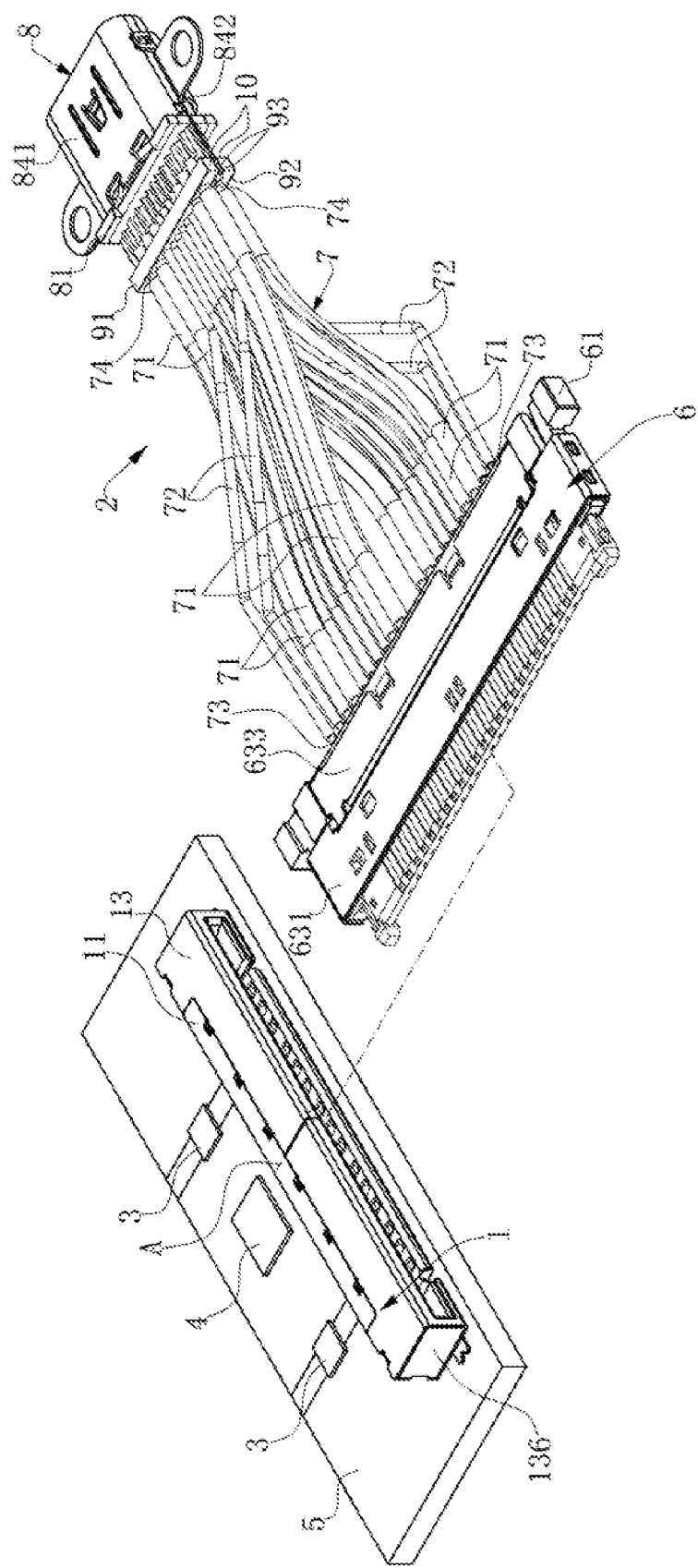
FIG. 1 is a partially exploded view of an electrical connector assembly according to certain embodiments of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-7. In accordance with the purposes of this invention, as embodied and broadly described herein, this invention, in one aspect, relates to an electrical connector assembly.

Figure 2:
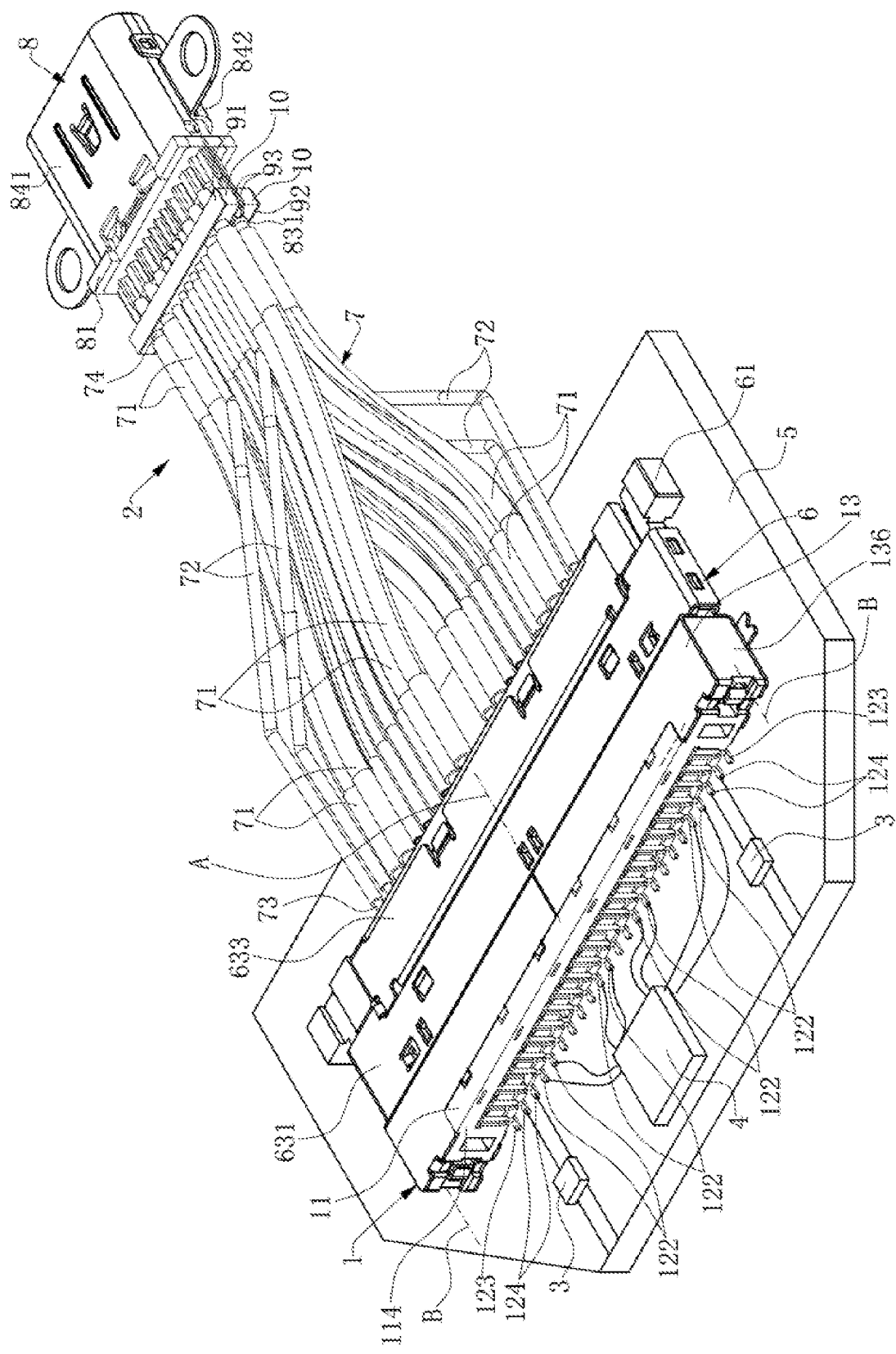
FIG. 2 is a perspective view of an electrical connector assembly according to certain embodiments of the present invention.
Figure 3:
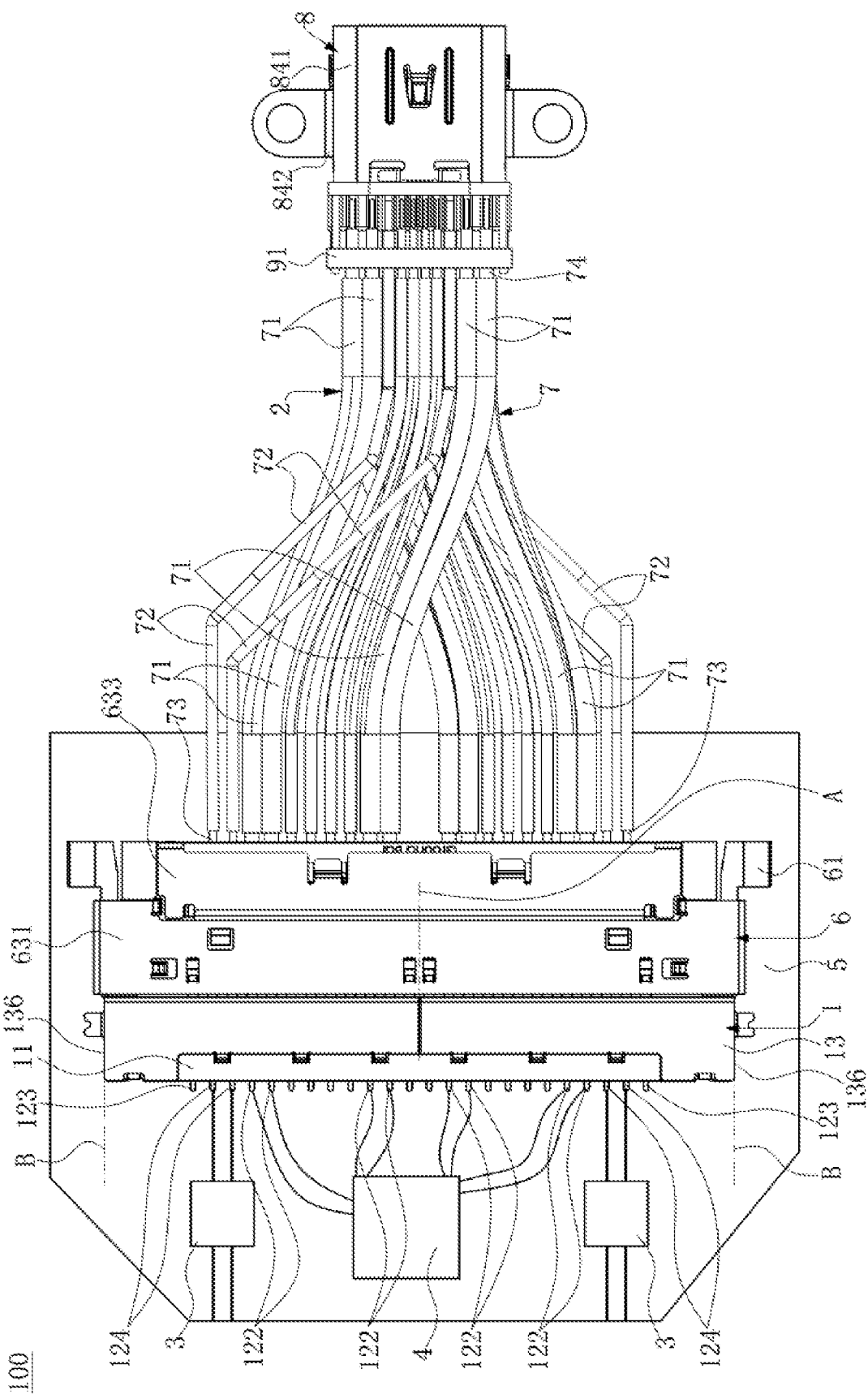
FIG. 3 is a top view of an electrical connector assembly according to certain embodiments of the present invention.

As shown in FIG. 1, FIG. 2 and FIG. 3, an electrical connector assembly 100 according to certain embodiments of the present invention includes a first connector 1, a cable connector subassembly 2, two filters 3, a chip 4 and a circuit board 5. The first connector 1 is provided on the circuit board 5. The cable connector subassembly 2 includes a second connector 6, a wire group 7 and a third connector 8.

As shown in FIG. 2, the second connector 6 is provided on the circuit board 5 and is mated with the first connector 1. The third connector 8 is electrically connected to the second connector 6 through the wire group 7. The filters 3 are provided on the circuit board 5 and are electrically connected to the first connector 1. The chip 4 is provided on the circuit board 5 and is electrically connected to the first connector 1.

Figure 5:
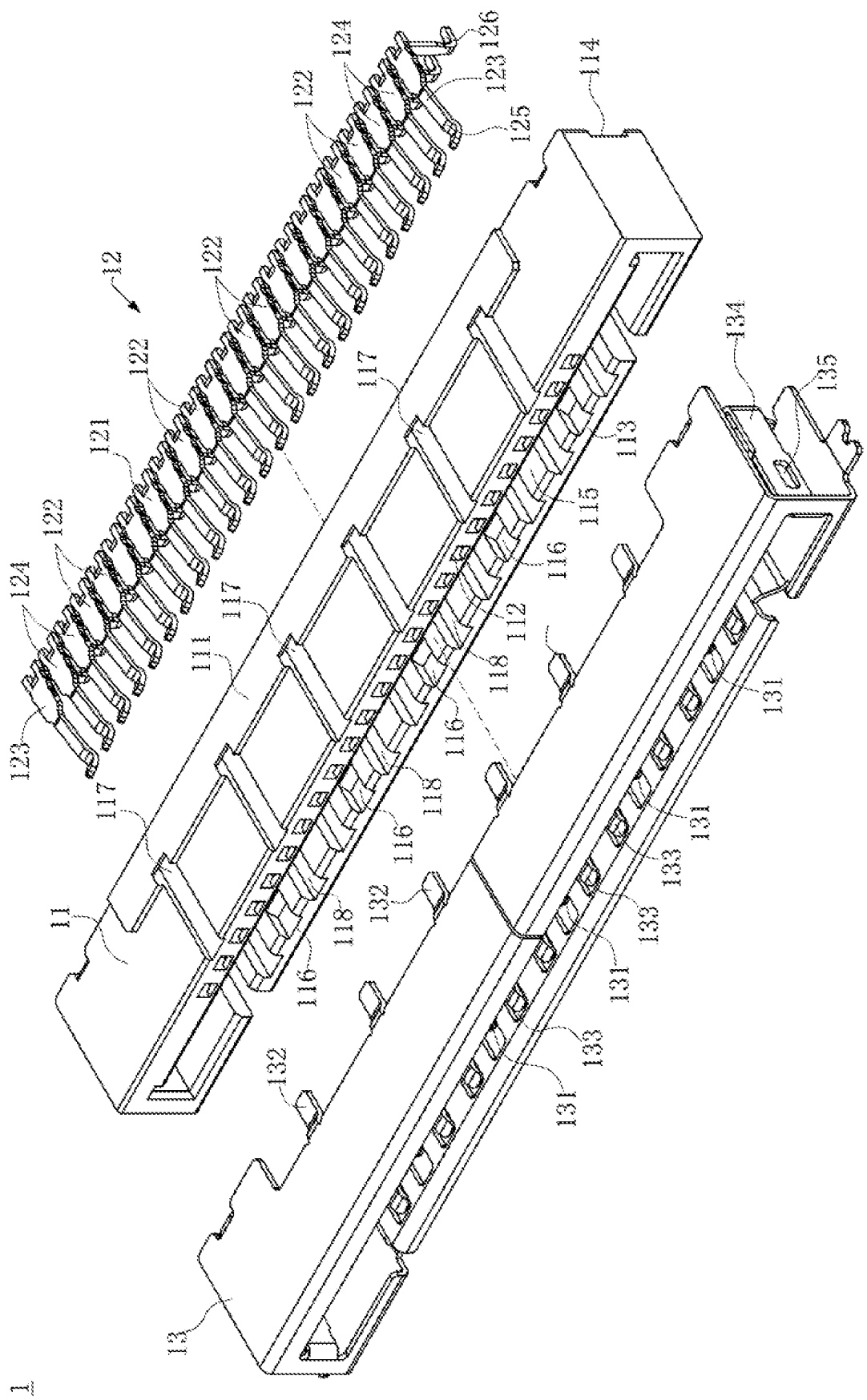
FIG. 5 is an exploded view of a first connector according to certain embodiments of the present invention.

As shown in FIG. 2, FIG. 3 and FIG. 5, the first connector 1 includes a first insulating body 11, a first terminal group 12 provided on the first insulating body 11 along a longitudinal direction, and a first shielding shell 13 partially covers the first insulating body 11 externally and is partially provided in the first insulating body 11. The first terminal group 12 is sequentially provided with twenty-four first terminals 121 along the longitudinal direction, which include eight first signal terminals 122, two first ground terminals 123 and four first power terminals 124. The two first ground terminals 123 are provided at two outermost edges of the first terminal group 12, and are sequentially arranged at positions 1 and 24 respectively. Two of the four first power terminals 124 are adjacent to each other, and the other two of the four first power terminals 124 are adjacent to each other. The four first power terminals 124 are sequentially arranged at positions 2, 3, 22 and 23. The two first power terminals 124 arranged at positions 2 and 3 are adjacent to the first ground terminal 123 arranged at the position 1, and the two first power terminals 124 arranged at positions 22 and 23 are adjacent to the first ground terminal 123 arranged at the position 24. The first ground terminal 123 arranged at the position 1 is located between the two first power terminals 124 arranged at the positions 2 and 3 and a corresponding edge of the first connector 1, and the first ground terminal 123 arranged at the position 24 is located between the two first power terminals 124 arranged at the positions 22 and 23 and the other corresponding edge of the first connector 1. The eight first signal terminals 122 include four first signal terminals 122, where two of the four first signal terminals 122 are adjacent to each other, the other two of the four first signal terminals 122 are adjacent to each other, and the four first signal terminals 122 are sequentially arranged at positions 4, 5, 20 and 21. The two first power terminals 124 arranged at the positions 2 and 3 are located between the two first signal terminals 122 arranged at the positions 4 and 5 and the first ground terminal 123 arranged at the position 1, and the two first power terminals 124 arranged at the positions 22 and 23 are located between the two first signal terminals 122 arranged at the positions 20 and 21 and the first ground terminal 123 arranged at the position 24. The other four first signal terminals 122 of the eight first signal terminals 122 are sequentially arranged at positions 10, 11, 14 and 15 respectively.

Figure 4:
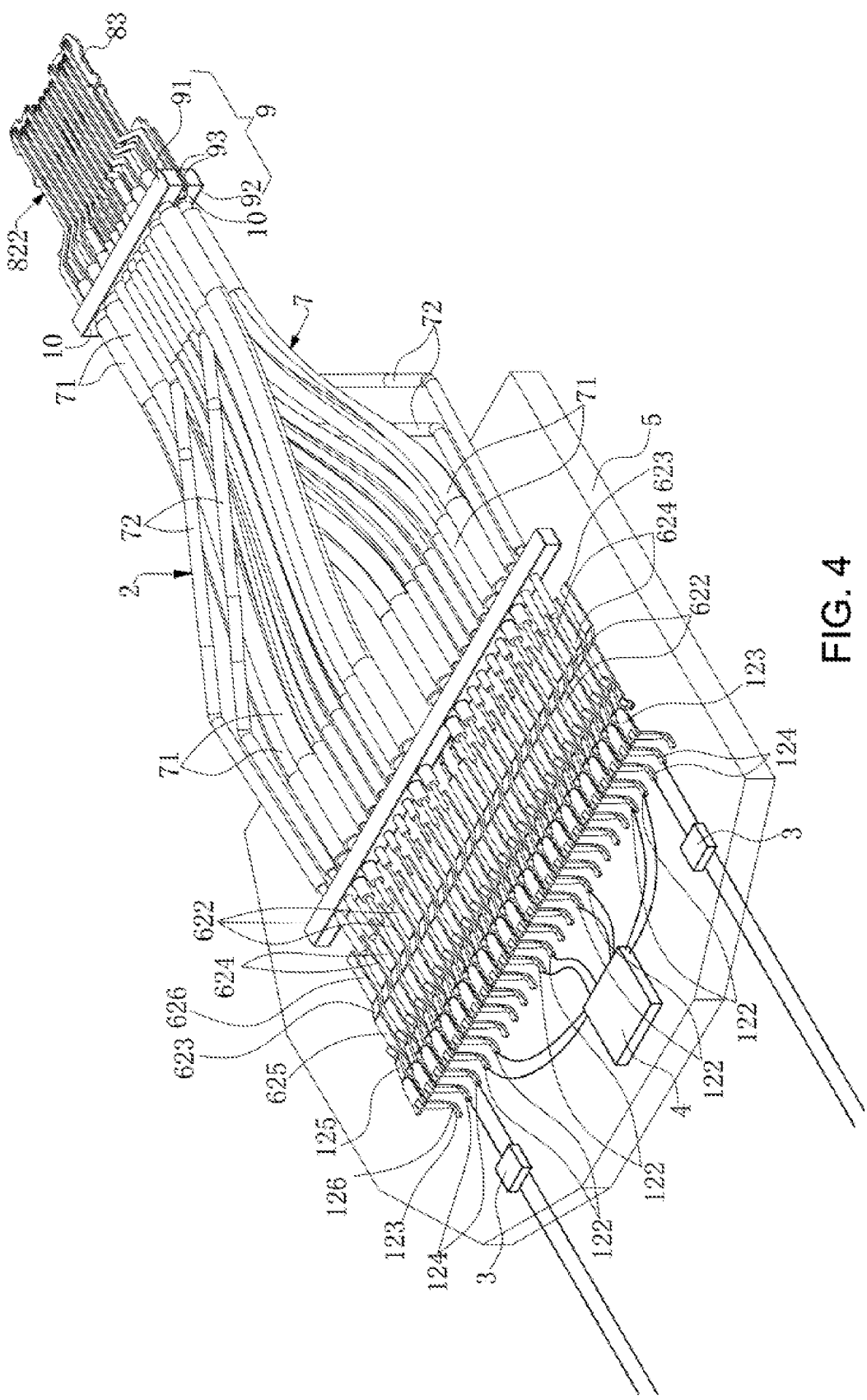
FIG. 4 is a perspective view of part of elements in the electrical connector assembly according to certain embodiments of the present invention.

As shown in FIG. 2, FIG. 3 and FIG. 4, the first connector 1 defines a center line A, and the center line A is parallel to an insertion direction of the first connector 1 and the second connector 6. Two filters 3 are provided, and the two filters 3 are symmetrically provided relative to the center line A and are provided at two sides of the chip 4. The chip 4 is located closer to the center line A than each filter 3, and the filters 3 and the chip 4 are arranged in a row along the longitudinal direction of the first connector 1. The first connector 1 has two edges 136 along the longitudinal direction, the two edges 136 of the first connector 1 define two edge lines B perpendicular to the longitudinal direction, and each of the edge lines B is parallel to the insertion direction of the first connector 1 and the second connector 6. The filters 3 and the edge of the chip 4 do not exceed the two edge lines B.

As shown in FIG. 2, FIG. 3 and FIG. 4, the two filters 3 are electrically connected to the first power terminals 124 respectively, and the chip 4 is electrically connected to the first signal terminals 122. Each first power terminal 124 is located closer to one of the two edges 136 of the first connector 1 than each first signal terminal 122. The chip 4 is provided right behind the first signal terminals 122. The filters 3 can be directly mounted right behind the first power terminals 124. The filters 3 and the chip 4 are arranged in a row along the longitudinal direction of the first connector 1. When transmitting a high-frequency signal to the chip 4, the first signal terminals 122 do not need to bypass the filters 3, such that the line design is simple and the cost is saved. A distance between each first signal terminal 122 and the chip 4 is less than a distance between each first power terminal 124 and the chip 4, thereby facilitating high-frequency signal transmission.

As shown in FIG. 5, the first insulating body 11 includes a first upper side wall 111, a first lower side wall 113 and a first rear wall 114. The first upper side wall 111, the first lower side wall 113 and the first rear wall 114 jointly define an accommodating cavity 115. The first upper side wall 111 and the first lower side wall 113 are provided opposite to each other, and the first rear wall 114 is used for connecting the first upper side wall 111 and the first lower side wall 113. The first upper side wall 111 is provided with multiple first accommodating grooves 112, and the first terminals 121 are inserted into the first accommodating grooves 112. Each first terminal 121 includes a first mating portion 125 and a first soldering portion 126 extending backward from the first mating portion 125. The first soldering portion 126 extends out of the first rear wall 114. The first mating portion 125 extends into the accommodating cavity 115. An outer surface of the first upper side wall 111 is provided with multiple outer buckling grooves 117, and an inner surface of the first lower side wall 113 is provided with multiple inner buckling grooves 116 and multiple inner receiving grooves 118.

As shown in FIG. 5, the first shielding shell 13 is provided with multiple first inner buckling sheets 131, multiple first outer buckling sheets 132 and multiple first elastic sheets 133. The first inner buckling sheets 131 are buckled in the inner buckling grooves 116 on the inner surface of the first lower side wall 113. The first outer buckling sheets 132 are buckled in the outer buckling grooves 117 on the outer surface of the first upper side wall 111. The first elastic sheets 133 are received in the inner receiving grooves 118 on the inner surface of the first lower side wall 113. The first shielding shell 13 is provided with a pair of elastic arms 134 along a longitudinal direction thereof. The elastic arms 134 are inserted into the first insulating body 11, and each elastic arm 134 is provided with a metal hole 135.

Figure 6:
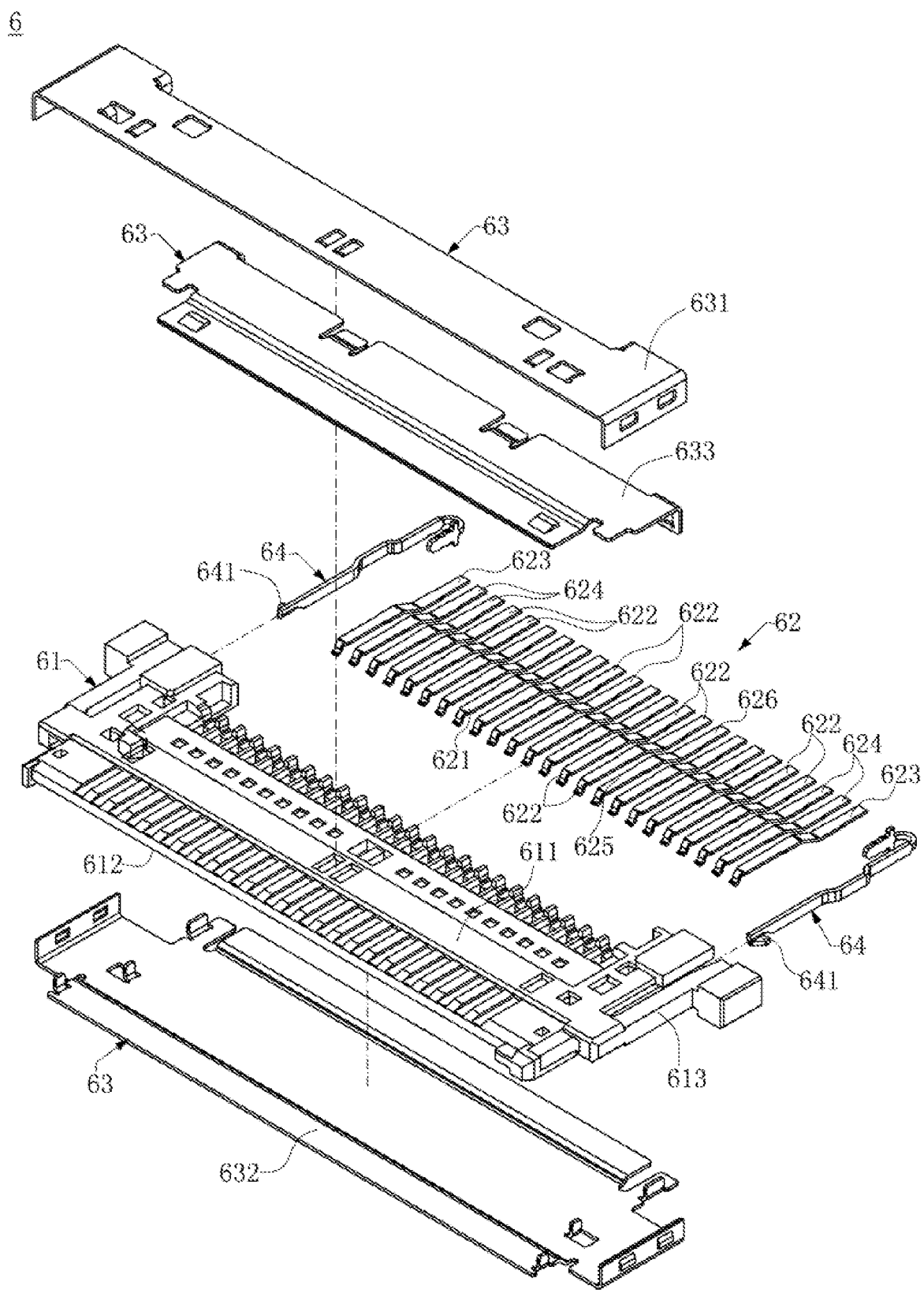
FIG. 6 is an exploded view of a second connector according to certain embodiments of the present invention.

As shown in FIG. 4 and FIG. 6, the second connector 6 includes a second insulating body 61, a second terminal group 62, a second shielding shell 63 and a pair of metal hooks 64. The second terminal group 62 is provided on the second insulating body 61 along the longitudinal direction. The second shielding shell 63 covers the second insulating body 61. The second terminal group 62 is sequentially provided with twenty-four second terminals 621 along the longitudinal direction, which include eight second signal terminals 622, two second ground terminals 623 and four second power terminals 624. The two second ground terminals 623 are provided at two edges of the second connector 6, and are sequentially arranged at positions 1 and 24 respectively. The four second power terminals 624 are respectively arranged in positions adjacent to the second ground terminals 623, and are sequentially arranged at positions 2, 3, 22 and 23. Four second signal terminals 622 of the eight second signal terminals 622 are respectively arranged in positions adjacent to the second power terminals 624, and are sequentially arranged at positions 4, 5, 20 and 21, and the other four second signal terminals 622 of the eight second signal terminals 622 are sequentially arranged at positions 10, 11, 14 and 15 respectively.

As shown in FIG. 4, the first ground terminals 123 are mated with the second ground terminals 623, the first signal terminals 122 are mated with the second signal terminals 622, and the first power terminals 124 are mated with the second power terminals 624.

As shown in FIG. 1 and FIG. 6, the second insulating body 61 includes an upper surface 611 and a lower surface 612, and the second insulating body 61 is provided with two clamping grooves 613 along the longitudinal direction. The second terminals 621 are embedded and formed in the second insulating body 61. Each second terminal 621 includes a second mating portion 625 and a second soldering portion 626 extending from the second mating portion 625. The second mating portion 625 is exposed to the upper surface 611 of the second insulating body 61. The second soldering portion 626 is provided on the upper surface 611 of the second insulating body 61. The second insulating body 61 is partially inserted and accommodated in the accommodating cavity 115 of the first insulating body 11, and each second mating portion 625 is interconnected to each first mating portion 125.

As shown in FIG. 3 and FIG. 6, the second shielding shell 63 includes an upper shielding shell 631, a lower shielding shell 632 and a rear shielding shell 633. The upper shielding shell 631 and the rear shielding shell 633 cover the upper surface 611 of the second insulating body 61, and the lower shielding shell 632 covers the lower surface 612 of the second insulating body 61. The metal hooks 64 are respectively inserted in the clamping grooves 613 at two sides of the second insulating body 61 along the longitudinal direction. Each metal hook 64 is provided with a metal protruding block 641, and each metal protruding block 641 is buckled in the metal hole 135 on each elastic arm 134 of the first shielding shell 13.

As shown in FIG. 2 and FIG. 4, the wire group 7 includes a first end 73 connected to the second connector 6 and a second end 74 connected to the third connector 8. The wire group 7 includes multiple signal wires 71 and multiple power wires 72. At the first end 73 of the wire group 7 connected to the second connector 6, the signal wires 71 and the power wires 72 are provided in a single row along the longitudinal direction so as to facilitate thinning of the second connector 6 and conveniently mounting the same in an electrical equipment. The wire group 7 is soldered to the second soldering portion 626 of the second terminal group 62. The signal wires 71 are electrically connected to the second signal terminals 622, and the power wires 72 are electrically connected to the second power terminals 624. At the first end 73 of the wire group 7, the power wires 72 are distributed at the two outermost edges of the single row along the longitudinal direction.

Figure 7:
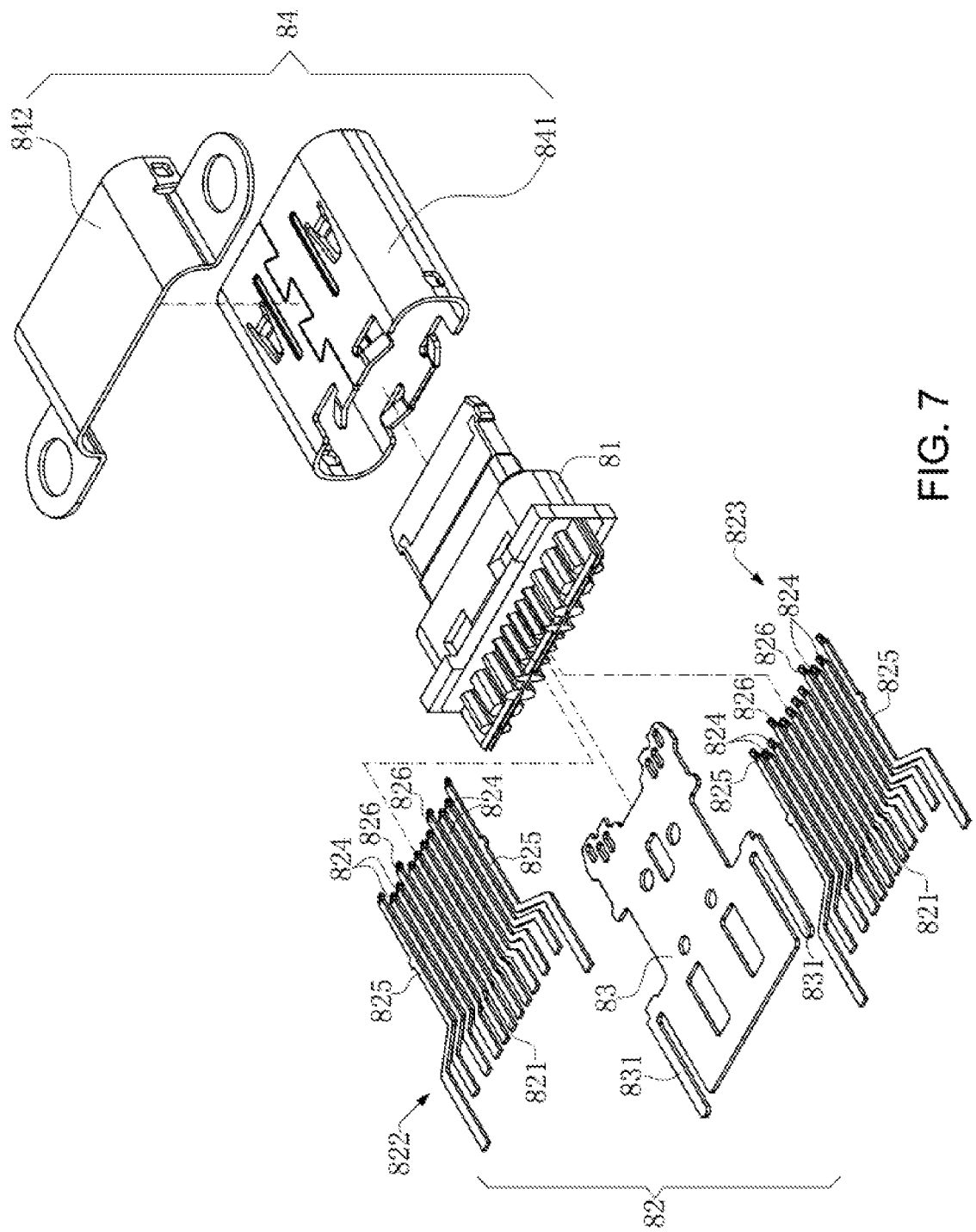
FIG. 7 is an exploded view of a third connector according to certain embodiments of the present invention.

As shown in FIG. 4 and FIG. 7, the third connector 8 is a type C connector. The third connector 8 includes a third insulating body 81, a third terminal group 82, a middle shielding sheet 83 and a third shielding shell 84. The third terminal group 82 is provided on the third insulating body 81 along the longitudinal direction. The third shielding shell 84 covers the third insulating body 81. The third terminal group 82 includes upper row terminals 822 and lower row terminals 823. The middle shielding sheet 83 is provided between the upper row terminals 822 and the lower row terminals 823. The upper row terminals 822 and the lower row terminals 823 are respectively and sequentially provided with twelve third terminals 821 along the longitudinal direction, so the third terminal group 82 includes twelve third terminals 821 in an upper row and twelve third terminals in a lower row. The middle shielding sheet 83 is provided between the third terminals 821 in the upper row and the third terminals 821 in the lower row. The twelve third terminals 821 in the upper row and the twelve third terminals 821 in the lower row respectively include two third ground terminals 825, four third signal terminals 824 and two third power terminals 826. The two third ground terminals 825 are arranged at two outermost edges of the third connector 8, and are sequentially arranged at positions 1 and 12. The four third signal terminals 824 are sequentially arranged at positions 2, 3, 10 and 11. The two third signal terminals 824 arranged at the positions 2 and 3 are adjacent to the third ground terminal 825 arranged at the position 1, and the two third signal terminals 824 arranged at the positions 10 and 11 are adjacent to the third ground terminal 825 arranged at the position 12. The two third power terminals 826 are sequentially arranged at positions 4 and 9. The third power terminal 826 arranged at the position 4 is adjacent to the third signal terminals 824 arranged at the positions 2 and 3, and the third power terminal 826 arranged at the position 9 is adjacent to the third signal terminals 824 arranged at the positions 10 and 11. Two pins 831 are provided at two sides of the middle shielding sheet 83. The third shielding shell 84 includes a third inner shielding shell 841 and a third outer shielding shell 842. The third inner shielding shell 841 covers the outer side of the third insulating body 81, and the third outer shielding shell 842 covers the outer side of the third inner shielding shell 841.

As shown in FIG. 1, FIG. 2 and FIG. 4, at the second end 74 of the wire group 7 connected to the third connector 8, the signal wires 71 and the power wires 72 are provided in an upper low and a lower row. The signal wires 71 are electrically connected to the third signal terminals 824, and the power wires 72 are electrically connected to the third power terminals 826. At the second end 74 of the wire group 7, each of the power wires 72 is positioned between at least two of the signal wires 71. Thus, the relative arrangement of the power wires 72 and the signal wires 71 in the wire group 7 along the longitudinal direction is changed by utilizing the bendable characteristics of the wire group 7. In this embodiment, the third connector 8 is directly soldered with the wire group 7 to form electrical connection. In other embodiments, the third connector 8 can also be electrically connected to the wire group 7 through an adapter plate (not shown). That is, the third connector 8 is soldered to one end of the adapter plate, and the wire group 7 is soldered to the other end of the adapter plate so as to be electrically connected to the third connector 8. Due to the layout of the line arrangement inside the adapter plate, a solder pad corresponding to the power wires 72 at the other end of the adapter plate is positioned at an outermost side; and the power wires 72 in the wire group 7 are distributed at two sides of the edge of the wire group 7 along the longitudinal direction, thereby facilitating connection between the power wires 72 of the wire group 7 and the second connector 6.

As shown in FIG. 2, FIG. 4 and FIG. 7, the second end 74 of the wire group 7 which is adjacent to the third connector 8 is provided with multiple grounding sheets 9 and solder pastes 10. The grounding sheets 9 include an upper grounding sheet 91, a lower grounding sheet 92 and two middle grounding sheets 93. The solder pastes 10 are provided between the upper grounding sheet 91 and one of the middle grounding sheets 93 and between the lower grounding sheet 92 and the other middle grounding sheet 93. The wire group 7 is soldered to the third signal terminals 824 and the third power terminals 826 through the solder pastes 10. The third ground terminals 825 are soldered to the middle grounding sheets 93 through the solder pastes 10. Each middle shielding sheet 83 is provided with multiple pins 831, and the pins 831 are provided between the two middle grounding sheets 93. The pins 831 are provided between the two middle grounding sheets 93 and soldered to the middle grounding sheets 93, so as to achieve a better shielding effect.

In the description of the present invention, it will be understood that the direction or position relationships indicated by terms such as "left," "right," "upper," "lower," "front," "rear," "width," "perpendicular," "opposite to," "vertical" and "oblique" are the direction or position relationships based on drawings, which is only provided for the convenience of describing the present invention and simplifying the description, but is not intended to indicate or imply that the devices or elements must have defined directions or structured and operated by specific directions, and therefore the present invention is not limited thereto.

To sum up, the structure of the electrical connector according to certain embodiments of the present invention has the following beneficial effects.

(1) Each first power terminal 124 is located closer to one of the two edges 136 of the first connector 1 along the longitudinal direction than each first signal terminal 122. The chip 4 is provided right behind the first signal terminals 122. The filters 3 can be directly mounted right behind the first power terminals 124. The filters 3 and the chip 4 are arranged in a row along the longitudinal direction of the first connector 1. When transmitting a high-frequency signal to the chip 4, the first signal terminals 122 do not need to bypass the filters 3, such that the circuit line design is simple and the cost is saved.

(2) A distance between each first signal terminal 122 and the chip 4 is less than a distance between each first power terminal 124 and the chip 4, thereby facilitating high-frequency signal transmission.

(3) At the first end 73 of the wire group 7 connected to the second connector 6, the signal wires 71 and the power wires 72 are provided in a single row along the longitudinal direction so as to facilitate thinning of the second connector 6 and conveniently mounting the same in an electrical equipment.

(4) The relative arrangement of the power wires 72 and the signal wires 71 in the wire group 7 along the longitudinal direction is changed by utilizing the bendable characteristics of the wire group 7.

(5) The third ground terminals 825 are provided in the solder pastes 10. Each middle shielding sheet 83 is provided with multiple pins 831, and the pins 831 are provided between the two middle grounding sheets 93. The pins 831 are provided between the two middle grounding sheets 93 and soldered to the middle grounding sheets 93, so as to achieve a better shielding effect.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector assembly, comprising:
a circuit board;
a first connector provided on the circuit board and having two edges along a longitudinal direction, the first connector comprising a first insulating body and a first terminal group, wherein the first terminal group is provided on the first insulating body along the longitudinal direction, the first terminal group comprises a plurality of first signal terminals and at least one first power terminal, and the first power terminal is located closer to one of the two edges of the first connector along the longitudinal direction than the first signal terminals;
a chip provided on the circuit board, wherein the chip is electrically connected to the first signal terminals;
at least one filter provided on the circuit board, wherein the filter is provided at one side of the chip, and the filter is electrically connected to the first power terminal;
a second connector connected to the first connector, the second connector comprising a second insulating body and a second terminal group, wherein the second terminal group comprises a plurality of second signal terminals and at least one second power terminal, each of the second signal terminals is connected to one of the first signal terminals, and the second power terminal is connected to the first power terminal; and a wire group electrically conductive to the second connector, wherein a distance between each of the first signal terminals and the chip is less than a distance between the first power terminal and the chip.

2. The electrical connector assembly according to claim 1, comprising two filters, wherein the two filters are respectively provided at two sides of the chip, the first terminal group comprises two first power terminals electrically connected to the two filters respectively, the first connector defines a center line, the center line is parallel to an insertion direction of the first connector and the second connector, and the chip is located closer to the center line than each of the two filters.

3. The electrical connector assembly according to claim 2, wherein the two filters are symmetrically provided relative to the center line.

4. The electrical connector assembly according to claim 1, wherein the filter and the chip are provided in a row along the longitudinal direction of the first connector.

5. The electrical connector assembly according to claim 1, wherein the two edges of the first connector define two edge lines perpendicular to the longitudinal direction, each of the edge lines is parallel to an insertion direction of the first connector and the second connector, and the filter and the chip do not pass beyond the two edge lines along the longitudinal direction.

6. The electrical connector assembly according to claim 1, wherein the first connector is provided with two first ground terminals, and each of the two first ground terminals is adjacent to one of the two edges of the first connector along the longitudinal direction.

7. The electrical connector assembly according to claim 6, wherein the first terminal group comprises four first power terminals, two of the four first power terminals are adjacent to each other, the other two of the four first power terminals are adjacent to each other, one of the two first ground terminals is located between one of the two edges of the first connector and the two of the four first power terminals adjacent to each other, and the other of the two first ground terminals is located between the other of the two edges and the other two of the four first power terminals adjacent to each other.

8. The electrical connector assembly according to claim 7, wherein the first signal terminals comprise four first signal terminals, two of the four first signal terminals are adjacent to each other, the other two of the four first signal terminals are adjacent to each other, the two of the four first power terminals adjacent to each other are located between the two of the four first signal terminals adjacent to each other and the one of the two first ground terminals, and the other two of the four first power terminals adjacent to each other are located between the other two of the four first signal terminals adjacent to each other and the other one of the two first ground terminals.

9. An electrical connector assembly comprising:
a circuit board;
a first connector provided on the circuit board and having two edges along a longitudinal direction, the first connector comprising a first insulating body and a first terminal group, wherein the first terminal group is provided on the first insulating body along the longitudinal direction, the first terminal group comprises a plurality of first signal terminals and at least one first power terminal, and the first power terminal is located closer to one of the two edges of the first connector along the longitudinal direction than the first signal terminals;

a chip provided on the circuit board, wherein the chip is electrically connected to the first signal terminals;

at least one filter provided on the circuit board, wherein the filter is provided at one side of the chip, and the filter is electrically connected to the first power terminal;

a second connector connected to the first connector, the second connector comprising a second insulating body and a second terminal group, wherein the second terminal group comprises a plurality of second signal terminals and at least one second power terminal, each of the second signal terminals is connected to one of the first signal terminals, and the second power terminal is connected to the first power terminal;

a wire group electrically conductive to the second connector, wherein the wire group comprises a plurality of signal wires and at least one power wire, the signal wires are connected to the second signal terminals, and the power wire is connected to the second power terminal; and a third connector, wherein the second connector is electrically connected to the third connector through the wire group, the third connector comprises a third insulating body, a third terminal group and a middle shielding sheet, the third terminal group is provided on the third insulating body along the longitudinal direction, the third terminal group comprises at least one third power terminal, a plurality of third signal terminals and a plurality of third ground terminals, the signal wires are electrically connected to the third signal terminals, and the power wire is electrically connected to the third power terminal, wherein the third terminal group comprises third terminals in an upper row and third terminals in a lower row, the middle shielding sheet is provided between the third terminals in the upper row and the third terminals in the lower row, and the third ground terminals are provided at two outermost sides of the third terminals in the upper row and the third terminals in the lower row.

10. The electrical connector assembly according to claim 9, wherein the wire group has a first end being connected to the second connector and a second end being connected to the third connector, the signal wires and the power wire at the first end of the wire group are arranged in a row along the longitudinal direction, and the signal wires and the power wire at the second end of the wire group are arranged in two rows vertically.

11. The electrical connector assembly according to claim 10, wherein the power wire at the first end of the wire group is provided at one of two outermost edges of the row.

12. The electrical connector assembly according to claim 10, wherein the power wire at the second end of the wire group is positioned between at least two of the signal wires.

13. The electrical connector assembly according to claim 9, wherein one end of the wire group adjacent to the third connector is provided with a plurality of grounding sheets and solder pastes, the grounding sheets comprise an upper grounding sheet, a lower grounding sheet and two middle grounding sheets, the solder pastes are respectively provided between the upper grounding sheet and one of the middle grounding sheets and between the lower grounding sheet and the other of the middle grounding sheets, the third ground terminals are soldered to the middle grounding sheets through the solder pastes, the middle shielding sheet is provided with a plurality of pins, and the pins are provided between the two middle grounding sheets and soldered to the middle grounding sheets.

14. An electrical connector assembly, comprising:
a circuit board;
a first connector provided on the circuit board and having two edges along a longitudinal direction, the first connector comprising a first insulating body and a first terminal group, wherein the first terminal group is provided on the first insulating body along the longitudinal direction, the first terminal group comprises a plurality of first signal terminals and two first power terminals, and each of the first power terminals is located closer to one of the two edges of the first connector along the longitudinal direction than the first signal terminals;
a chip provided on the circuit board, wherein the chip is electrically connected to the first signal terminals;
two filters provided on the circuit board, wherein the two filters are respectively provided at two sides of the chip, and the two first power terminals are electrically connected to the two filters respectively;
a second connector connected to the first connector, the second connector comprising a second insulating body and a second terminal group, wherein the second terminal group comprises a plurality of second signal terminals and at least one second power terminal, each of the second signal terminals is connected to one of the first signal terminals, and the second power terminal is connected to one of the first power terminals; and
a wire group electrically conductive to the second connector.

15. The electrical connector assembly according to claim 14, wherein the first connector defines a center line, the center line is parallel to an insertion direction of the first connector and the second connector, and the chip is located closer to the center line than each of the two filters.

16. The electrical connector assembly according to claim 15, wherein the two filters are symmetrically provided relative to the center line.

17. The electrical connector assembly according to claim 14, wherein the two edges of the first connector define two edge lines perpendicular to the longitudinal direction, each of the edge lines is parallel to an insertion direction of the first connector and the second connector, and the filters and the chip do not pass beyond the two edge lines along the longitudinal direction.

18. The electrical connector assembly according to claim 14, wherein the first connector is provided with two first ground terminals, and each of the two first ground terminals is adjacent to one of the two edges of the first connector along the longitudinal direction.

19. The electrical connector assembly according to claim 18, wherein the first terminal group comprises four first power terminals, two of the four first power terminals are adjacent to each other, the other two of the four first power terminals are adjacent to each other, one of the two first ground terminals is located between one of the two edges of the first connector and the two of the four first power terminals adjacent to each other, and the other of the two first ground terminals is located between the other of the two edges and the other two of the four first power terminals adjacent to each other.

20. The electrical connector assembly according to claim 19, wherein the first signal terminals comprise four first signal terminals, two of the four first signal terminals are adjacent to each other, the other two of the four first signal terminals are adjacent to each other, the two of the four first power terminals adjacent to each other are located between the two of the four first signal terminals adjacent to each other and the one of the two first ground terminals, and the other two of the four first power terminals adjacent to each other are located between the other two of the four first signal terminals adjacent to each other and the other one of the two first ground terminals.

* * * * *